(12) United States Patent
Nishina et al.

(10) Patent No.: US 10,188,010 B2
(45) Date of Patent: Jan. 22, 2019

(54) SEAL RING AND METHOD FOR MANUFACTURING SEAL RING

(71) Applicant: HITACHI METALS, LTD., Tokyo (JP)

(72) Inventors: Junya Nishina, Yasugi (JP); Keiichiro Maeda, Izumi (JP); Ken Asada, Izumi (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 15/933,649

(22) Filed: Mar. 23, 2018

(65) Prior Publication Data

US 2018/0213668 A1 Jul. 26, 2018

Related U.S. Application Data

(62) Division of application No. 14/396,643, filed as application No. PCT/JP2013/050583 on Jan. 15, 2013, now Pat. No. 9,961,791.

(30) Foreign Application Priority Data

Jun. 4, 2012 (JP) .................. 2012-127026

(51) Int. Cl.
*H05K 5/06* (2006.01)
*F16J 15/08* (2006.01)
(Continued)

(52) U.S. Cl.
CPC ............ *H05K 5/066* (2013.01); *B23K 35/30* (2013.01); *B23K 35/302* (2013.01);
(Continued)

(58) Field of Classification Search
CPC .... H05K 5/066; B23K 35/30; B23K 35/3006; B23K 35/302; B23K 35/3053;
(Continued)

(56) References Cited

U.S. PATENT DOCUMENTS 5,578,869 A * 11/1996 Hoffman ............... H01L 23/057
257/691
5,633,121 A 5/1997 Namiki et al.
(Continued)

FOREIGN PATENT DOCUMENTS

JP H01-305542 A 12/1989
JP H03-134198 A 6/1991
(Continued)

OTHER PUBLICATIONS

International Search Report dated Mar. 12, 2013 issued in corresponding application No. PCT/JP2013/050583.
(Continued)

*Primary Examiner* — Eugene G Byrd
(74) *Attorney, Agent, or Firm* — Westerman, Hattori, Daniels & Adrian, LLP

(57) ABSTRACT

This seal ring (1) is made of a clad material in which a base material layer (10) and a brazing filler metal layer (11) arranged on a first surface (10*b*) of the base material layer are bonded to each other, and a side brazing filler metal portion (11*f*) of the brazing filler metal layer covering a side surface (10*c*) of the base material layer is removed.

16 Claims, 7 Drawing Sheets

(51) Int. Cl.
*F16J 15/06* (2006.01)
*B23K 35/30* (2006.01)
*C22C 5/08* (2006.01)
*H01L 23/10* (2006.01)
*B32B 15/01* (2006.01)
*C22C 38/10* (2006.01)

(52) U.S. Cl.
CPC ...... *B23K 35/3006* (2013.01); *B23K 35/3053* (2013.01); *B32B 15/013* (2013.01); *B32B 15/018* (2013.01); *C22C 5/08* (2013.01); *C22C 38/105* (2013.01); *F16J 15/064* (2013.01); *F16J 15/0806* (2013.01); *H01L 23/10* (2013.01); *H01L 2924/0002* (2013.01); *Y10T 29/49998* (2015.01)

(58) Field of Classification Search
CPC ....... B32B 15/013; B32B 15/018; C22C 5/08; C22C 38/105; F16J 15/064; F16J 15/0806; H01L 23/10
See application file for complete search history.

(56) References Cited

U.S. PATENT DOCUMENTS

| | | | |
|---|---|---|---|
| 6,351,032 B1* | 2/2002 | Lee | H01L 21/563 257/706 |
| 6,621,392 B1 | 9/2003 | Volant et al. | |
| 6,762,667 B2 | 7/2004 | Volant et al. | |
| 8,455,324 B2 | 6/2013 | Fukuda et al. | |
| 8,455,325 B2 | 6/2013 | Fukuda et al. | |
| 2005/0273993 A1* | 12/2005 | Renteria | F16J 15/0806 29/458 |
| 2006/0125076 A1 | 6/2006 | Fukagaya et al. | |
| 2008/0128746 A1* | 6/2008 | Wang | H01L 29/6656 257/190 |
| 2011/0003228 A1* | 1/2011 | Zerfass | F16J 15/102 429/452 |
| 2012/0009809 A1 | 1/2012 | Kataoka | |
| 2014/0196935 A1* | 7/2014 | Tojo | H01L 23/10 174/255 |

FOREIGN PATENT DOCUMENTS

| | | |
|---|---|---|
| JP | H05-013920 A | 1/1993 |
| JP | H05-144956 A | 6/1993 |
| JP | H05-343548 A | 12/1993 |
| JP | H06-308044 A | 11/1994 |
| JP | H07-326827 A | 12/1995 |
| JP | H09-184905 A | 7/1997 |
| JP | H09-298021 A | 11/1997 |
| JP | H11-067742 A | 3/1999 |
| JP | 2001-77222 A | 3/2001 |
| JP | 2003-68901 A | 3/2003 |
| JP | 2003-133449 A | 5/2003 |
| JP | 2004-006210 A | 1/2004 |
| JP | 2004-006310 A | 1/2004 |
| JP | 2004-241442 A | 8/2004 |
| JP | 2004-253463 A | 9/2004 |
| JP | 2005-105411 A | 4/2005 |
| JP | 2005-198087 A | 7/2005 |
| JP | 2006-49595 A | 2/2006 |
| JP | 2009-206462 A | 9/2009 |
| JP | 2010-097963 A | 4/2010 |
| JP | 2010-103407 A | 5/2010 |
| JP | 2011-029524 A | 2/2011 |
| TW | 201124562 A | 7/2011 |

OTHER PUBLICATIONS

Office Action dated Apr. 1, 2016, issued in counterpart Korean Patent Application No. 10-2014-7030110, with English translation. (19 pages).

Office Action dated Jun. 7, 2016, issued in counterpart Japanese Patent Application No. 2014-519851, with English translation. (6 pages).

Office Action dated Aug. 5, 2016, issued in counterpart Taiwanese Patent Application No. 102119570, with English translation. (25 pages).

Office Action dated Aug. 26, 2016, issued in counterpart Chinese Patent Application No. 201380029283.6, with English translation. (19 pages).

Office Action dated Dec. 29, 2016, issued in counterpart Taiwanese Patent Application No. 102119570, with English translation. (15 pages).

Office Action dated Mar. 8, 2017, issued in counterpart Chinese Application No. 201380029283.6, with English translation. (12 pages).

Akira Yokoyama, "Illustrated Alloy State Illustration Readings", Ohmsha, Ltd, Jun. 25, 1974, pp. 60-85.

* cited by examiner

| | | Cu | Ag |
|---|---|---|---|
| CONCENTRATIONS OF Cu AND Ag IN SURFACE (MASS %) | | | |
| COMPARATIVE EXAMPLE 2 | BEFORE ETCHING | 16.9 | 83.1 |
| | | 20.5 | 79.6 |
| EXAMPLE 2 (CORRESPONDING TO FIRST EMBODIMENT) | AFTER ETCHING (NO SULFURIC ACID ADDED) | 44.1 | 55.9 |
| | | 36.4 | 63.6 |
| EXAMPLE 3 | AFTER ETCHING (0.7 MASS % of SULFURIC ACID ADDED) | 3.3 | 96.7 |
| | | 3.1 | 96.9 |

FIG.14

| SOLIDUS LINE | | | | | |
|---|---|---|---|---|---|
| | COMPARATIVE EXAMPLE 2 (BEFORE ETCHING) | EXAMPLE 4 | EXAMPLE 5 | EXAMPLE 3 | EXAMPLE 6 |
| SULFURIC ACID CONCENTRATION (MASS %) | 0 | 0.3 | 0.5 | 0.7 | 1.0 |
| SOLIDUS LINE (°C) | 776.0 | 776.1 | 776.4 | 776.3 | 777.4 |

FIG.15

| CONCENTRATIONS OF O, Cu, AND Ag IN SURFACE AFTER CONSTANT TEMPERATURE AND HUMIDITY TEST (MASS %) | | | | |
|---|---|---|---|---|
| | O (OXYGEN) | Cu (COPPER) | Ag (SILVER) | REMAINING PORTION |
| COMPARATIVE EXAMPLE 2 (BEFORE ETCHING) | 26.06 | 16.62 | 48.62 | 8.70 |
| EXAMPLE 3 | 13.39 | 7.70 | 73.68 | 5.23 |

SEAL RING AND METHOD FOR MANUFACTURING SEAL RING

CROSS-REFERENCE TO RELATED APPLICATIONS

This application is a divisional of U.S. application Ser. No. 14/396,643 filed Oct. 23, 2014, which is based upon and claims the benefit of priority of the prior International Application No. PCT/JP2013/050583, filed on 2013 Jan. 15 Jan. 15, 2013, the entire contents of which are incorporated herein by reference.

TECHNICAL FIELD

The present invention relates to a seal ring employed in an electronic component housing package and a method for manufacturing a seal ring.

BACKGROUND ART

In general, a seal ring or the like employed in an electronic component storing package is known. In Japanese Patent Laying-Open No. 2006-49595, for example, there are disclosed a method for forming a silver solder clad material including a base material layer made of Fe—Ni—Co alloy and a silver-based brazing filler metal layer by firing or the like after applying a paste made of a mixture of silver-based brazing filler metal powder containing Ag, Cu, and Sn and media onto one surface of a base material made of a Fe—Ni—Co alloy plate, and thereafter forming a ring body (seal ring) by punching the silver solder clad material in a ring shape.

If a tiny protrusion (burr) is formed on a surface of the base material layer closer to the silver-based brazing filler metal layer to protrude toward the silver-based brazing filler metal layer when the silver solder clad material is punched in the ring shape, an interval between the surface of the base material layer closer to the silver-based brazing filler metal layer and a base is increased due to the tiny protrusion when the silver-based brazing filler metal layer of the ring body is melted to bond the base of an electronic component storing package and the ring body to each other. Consequently, a clearance is easily generated between the ring body and the base, and hence there is such a problem that the sufficient airtightness of the electronic component storing package is not retained in the case where the electronic component storing package is constituted by the ring body and the base. Therefore, the tiny protrusion is formed to protrude toward the base material layer when the silver solder clad material is punched in the ring shape.

PRIOR ART DOCUMENT

Patent Document

Patent Document 1: Japanese Patent Laying-Open No. 2006-49595

SUMMARY OF THE INVENTION

Problem to be Solved by the Invention

However, in the case where the ring body disclosed in Japanese Patent Laying-Open No. 2006-49595 is formed by punching such that the tiny protrusion protrudes toward the base material layer, the silver-based brazing filler metal layer stretches and is arranged to cover a side surface of the base material layer. Thus, there is such a disadvantage that the silver-based brazing filler metal layer excessively crawls up the side surface of the base material layer through the silver-based brazing filler metal layer covering the side surface of the base material layer when the silver-based brazing filler metal layer of the ring body is melted to bond the base and the ring body to each other. Consequently, in the case where the electronic component storing package is constituted by the ring body and a lid material, the silver-based brazing filler metal layer excessively crawling up the side surface of the base material layer by heat generated during manufacturing of the electronic component storing package spreads to the lid material. Thus, there may be such a problem that the silver-based brazing filler metal layer spreading to the lid material is scattered from the lid material and is attached to an electronic component stored in the electronic component storing package.

The present invention has been proposed in order to solve the aforementioned problem, and an object of the present invention is to provide a seal ring and a method for manufacturing a seal ring each in which a brazing filler metal layer can be inhibited from being scattered and being attached to an electronic component by inhibiting the brazing filler metal layer from excessively crawling up a side surface of a base material layer.

Means for Solving the Problem

A seal ring according to a first aspect of the present invention is employed in an electronic component storing package and is made of a clad material in which a base material layer and a brazing filler metal layer arranged on a first surface of the base material layer are bonded to each other, and a side brazing filler metal portion of the brazing filler metal layer covering a side surface of the base material layer is removed.

In the seal ring according to the first aspect of the present invention, as hereinabove described, the side brazing filler metal portion of the brazing filler metal layer covering a side surface of the base material layer is removed, whereby the brazing filler metal layer can be inhibited from excessively crawling up the side surface of the base material layer through the side brazing filler metal portion when the brazing filler metal layer of the seal ring is melted. Thus, the brazing filler metal layer can be inhibited from being scattered due to heat or the like in manufacturing the electronic component storing package and being attached to an electronic component stored in the electronic component storing package.

In the aforementioned seal ring according to the first aspect, the base material layer preferably includes a rounded corner connecting the first surface of the base material layer and the side surface substantially flattened to each other, and at least the side brazing filler metal portion of the brazing filler metal layer covering the side surface substantially flattened is preferably removed. According to this structure, the side brazing filler metal portion covering the side surface substantially flattened is removed, and hence the brazing filler metal layer can be further inhibited from excessively crawling up the side surface of the base material layer. The "side surface substantially flattened" includes not only a flattened side surface but also a side surface formed with a tiny concavity and convexity and a side surface capable of being considered to be substantially flattened, such as a side surface having a curvature radius sufficiently larger than the curvature radius of the rounded corner.

In the aforementioned seal ring according to the first aspect, the base material layer preferably mainly contains Fe, Ni, and Co, and the brazing filler metal layer preferably mainly contains Ag and Cu. In the seal ring made of the clad material in which the base material layer mainly containing Fe, Ni, and Co and the brazing filler metal layer mainly containing Ag and Cu are bonded to each other, as described above, the side brazing filler metal portion of the brazing filler metal layer covering the side surface of the base material layer is removed, whereby the brazing filler metal layer can be inhibited from excessively crawling up the side surface of the base material layer through the side brazing filler metal portion.

In the aforementioned seal ring according to the first aspect, the brazing filler metal layer preferably mainly contains Ag and Cu, and the concentration of Ag is preferably larger in the vicinity of a surface of the brazing filler metal layer than in an inner portion of the brazing filler metal layer. According to this structure, Ag has corrosion resistance as compared with Cu, and hence due to Ag in the vicinity of the surface of the brazing filler metal layer, the corrosion resistance of the surface of the brazing filler metal layer can be improved. Furthermore, the concentration of Ag in the vicinity of the surface of the brazing filler metal layer is large, whereby the color of the surface of the brazing filler metal layer can be brought close to silver.

A method for manufacturing a seal ring according to a second aspect of the present invention is a method for manufacturing a seal ring employed in an electronic component storing package and includes steps of preparing a clad material of a base material layer and a brazing filler metal layer bonded to a first surface of the base material layer, punching the clad material in the form of the seal ring, and removing a side brazing filler metal portion of the brazing filler metal layer formed by stretching of the brazing filler metal layer when the clad material is punched in the form of the seal ring, covering a side surface of the base material layer.

As hereinabove described, the method for manufacturing a seal ring according to the second aspect of the present invention includes the step of removing the side brazing filler metal portion of the brazing filler metal layer formed by the stretching of the brazing filler metal layer when the clad material is punched in the form of the seal ring, covering the side surface of the base material layer, whereby the brazing filler metal layer can be inhibited from excessively crawling up the side surface of the base material layer through the side brazing filler metal portion when the brazing filler metal layer of the seal ring is melted. Thus, the brazing filler metal layer can be inhibited from being scattered due to heat or the like in manufacturing the electronic component storing package and being attached to an electronic component stored in the electronic component storing package.

In the aforementioned method for manufacturing a seal ring according to the second aspect, the base material layer preferably includes a rounded corner connecting the first surface of the base material layer and the side surface substantially flattened to each other, and the step of removing the side brazing filler metal portion preferably includes a step of removing at least the side brazing filler metal portion of the brazing filler metal layer covering the side surface substantially flattened. According to this structure, the side brazing filler metal portion covering the side surface substantially flattened is removed, and hence the brazing filler metal layer can be further inhibited from excessively crawling up the side surface of the base material layer.

In the aforementioned method for manufacturing a seal ring according to the second aspect, the step of removing the side brazing filler metal portion preferably includes a step of removing the side brazing filler metal portion by wet etching. According to this structure, the small side brazing filler metal portion covering the side surface of the base material layer can be reliably removed as compared with the case where the side brazing filler metal portion is removed by mechanical polishing or the like.

In this case, the step of removing the side brazing filler metal portion by the wet etching preferably includes a step of removing the side brazing filler metal portion by isotropically removing the brazing filler metal layer by the wet etching. According to this structure, complicated etching processing is not required to selectively remove the side brazing filler metal portion, and hence the side brazing filler metal portion can be easily removed.

In the aforementioned method for manufacturing a seal ring including the step of isotropically removing the side brazing filler metal portion by the wet etching, the step of isotropically removing the brazing filler metal layer by the wet etching preferably includes a step of removing the side brazing filler metal portion by the wet etching and roundly forming a corner of the brazing filler metal layer. According to this structure, the corner of the brazing filler metal layer is rounded not pointed, and hence other members can be inhibited from being damaged when a pointed corner of the brazing filler metal layer comes into contact with the other members or the like.

In the aforementioned method for manufacturing a seal ring including the step of removing the side brazing filler metal portion by the wet etching, the step of removing the side brazing filler metal portion by the wet etching preferably includes a step of removing the side brazing filler metal portion with an etching solution with which the brazing filler metal layer is easily etched and the base material layer is hardly etched. According to this structure, the brazing filler metal layer can be easily selectively etched.

In the aforementioned method for manufacturing a seal ring including the step of removing the side brazing filler metal portion with the etching solution with which the brazing filler metal layer is easily etched, the base material layer preferably mainly contains Fe, Ni, and Co, the brazing filler metal layer preferably mainly contains Ag and Cu, and the etching solution preferably contains at least an oxidizing agent oxidizing a surface of the brazing filler metal layer, an oxide removing agent removing the brazing filler metal layer which has been oxidized, and water. According to this structure, the side brazing filler metal portion can be reliably removed by selectively etching the brazing filler metal layer mainly containing Ag and Cu.

In the aforementioned method for manufacturing a seal ring in which the etching solution contains the oxidizing agent, the oxide removing agent, and the water, the etching solution preferably contains at least the oxidizing agent of hydrogen peroxide, the oxide removing agent of an acetic acid, and the water. According to this structure, the side brazing filler metal portion can be more reliably removed by more selectively etching the brazing filler metal layer mainly containing Ag and Cu.

In the aforementioned method for manufacturing a seal ring including the step of removing the side brazing filler metal portion by the wet etching, the brazing filler metal layer preferably mainly contains Ag and Cu, an etching solution of the wet etching preferably contains an oxidizing agent oxidizing a surface of the brazing filler metal layer, an oxide removing agent removing the brazing filler metal layer which has been oxidized, water, and a Cu preferentially removing agent preferentially removing the Cu in the surface of the brazing filler metal layer, and the step of removing the side brazing filler metal portion by the wet etching preferably includes a step of rendering the concentration of Ag larger in the vicinity of the surface of the brazing filler metal layer than in an inner portion of the brazing filler metal layer by preferentially removing Cu in the surface of the brazing filler metal layer with the etching solution. According to this structure, Ag has corrosion resistance as compared with Cu, and hence due to Ag in the vicinity of the surface of the brazing filler metal layer, the corrosion resistance of the surface of the brazing filler metal layer can be improved. Furthermore, the concentration of Ag in the vicinity of the surface of the brazing filler metal layer is large, whereby the color of the surface of the brazing filler metal layer can be brought close to silver. In addition, Cu in the surface of the brazing filler metal layer can be preferentially removed with the etching solution to which the Cu preferentially removing agent is added, and hence the concentration of Ag in the vicinity of the surface of the brazing filler metal layer can be easily rendered larger than the concentration of Ag in the inner portion of the brazing filler metal layer, and Ag can be caused to remain and be concentrated in the vicinity of the surface of the brazing filler metal layer.

In the aforementioned method for manufacturing a seal ring including the step of removing the side brazing filler metal portion by the wet etching, the brazing filler metal layer preferably mainly contains Ag and Cu, an etching solution of the wet etching preferably contains an oxidizing agent oxidizing a surface of the brazing filler metal layer, an oxide removing agent removing the brazing filler metal layer which has been oxidized, water, and a Cu preferentially removing agent preferentially removing Cu in the surface of the brazing filler metal layer, and the step of removing the side brazing filler metal portion by the wet etching preferably includes a step of rendering the concentration of Ag larger in the vicinity of the surface of the brazing filler metal layer than in the brazing filler metal layer before removal of the side brazing filler metal portion by the wet etching by preferentially removing Cu in the surface of the brazing filler metal layer with the etching solution. According to this structure, the concentration of Ag in the vicinity of the surface of the brazing filler metal layer can be rendered larger than that before the wet etching, and hence the corrosion resistance of the surface of the brazing filler metal layer can be improved, and the color of the surface of the brazing filler metal layer can be brought close to silver. Furthermore, the etching solution to which the Cu preferentially removing agent is added is employed, whereby the concentration of Ag in the vicinity of the surface of the brazing filler metal layer can be easily rendered larger than the concentration of Ag before the removal of the side brazing filler metal portion by the wet etching.

In the aforementioned method for manufacturing a seal ring in which the etching solution contains the oxidizing agent, the oxide removing agent, the water, and the Cu preferentially removing agent, the Cu preferentially removing agent preferably includes a strong acid. According to this structure, when the strong acid is employed, an oxide of Ag formed by the oxidizing agent is hardly removed, but an oxide of Cu is easily removed. Thus, the Cu preferentially removing agent of the strong acid is employed, whereby the oxide of Cu can be easily preferentially removed. Consequently, Cu in the surface of the brazing filler metal layer can be easily preferentially removed.

In the aforementioned method for manufacturing a seal ring in which the Cu preferentially removing agent includes the strong acid, the Cu preferentially removing agent preferably includes a sulfuric acid which is the strong acid. According to this structure, Cu in the surface of the brazing filler metal layer can be more easily preferentially removed.

In the aforementioned method for manufacturing a seal ring in which the Cu preferentially removing agent includes the sulfuric acid, the sulfuric acid is preferably added to the etching solution such that the concentration of the sulfuric acid is at least 0.5 mass % of an entire portion of the etching solution. According to this structure, the concentration of Ag can be rendered larger in the vicinity of the surface of the brazing filler metal layer than in the inner portion of the brazing filler metal layer by reliably preferentially removing Cu in the surface of the brazing filler metal layer.

In the aforementioned method for manufacturing a seal ring in which the etching solution contains the oxidizing agent, the oxide removing agent, the water, and the Cu preferentially removing agent, the solidus line of the brazing filler metal layer is preferably not substantially changed before and after the step of removing the side brazing filler metal portion by the wet etching. According to this structure, an increase in temperature required to melt the brazing filler metal layer resulting from a rise in the solidus line of the brazing filler metal layer can be suppressed.

In the aforementioned method for manufacturing a seal ring in which the etching solution contains the oxidizing agent, the oxide removing agent, the water, and the Cu preferentially removing agent, the step of removing the side brazing filler metal portion by the wet etching preferably also serves as a step of removing the brazing filler metal layer which has been oxidized, remaining on a surface of the seal ring and cleaning the seal ring. According to this structure, the process can be simplified, unlike the case where a step of removing the brazing filler metal layer which has been oxidized, remaining on the surface of the seal ring and cleaning the seal ring is provided separately.

The aforementioned method for manufacturing a seal ring including the step of removing the side brazing filler metal portion by the wet etching preferably further includes a step of removing a tiny protrusion of the base material layer formed when the clad material is punched in the form of the seal ring in advance of the step of removing the side brazing filler metal portion by the wet etching, and the step of removing the side brazing filler metal portion by the wet etching preferably includes a step of removing by the wet etching the side brazing filler metal portion and an extraneous material attached when the tiny protrusion is removed. According to this structure, the extraneous material is removed simultaneously during the wet etching for removing the side brazing filler metal portion, and hence the process can be simplified, unlike the case where a step of removing the extraneous material is provided separately.

Effect of the Invention

According to the present invention, as hereinabove described, the brazing filler metal layer can be inhibited from excessively crawling up the side surface of the base material layer, and hence the brazing filler metal layer can be inhibited from being scattered and being attached to the electronic component stored in the electronic component storing package.

BRIEF DESCRIPTION OF THE DRAWINGS

FIG. 14 A diagram showing results of measurement of the solidus line of the brazing filler metal layer conducted in order to confirm the effects of the second embodiment of the present invention.

FIG. 15 A diagram showing results of measurement of the concentrations of O (oxygen), Cu, and Ag in the surface of the brazing filler metal layer after a constant temperature and humidity test conducted in order to confirm the effects of a second embodiment of the present invention.

MODES FOR CARRYING OUT THE INVENTION

Embodiments embodying the present invention are hereinafter described on the basis of the drawings.

First Embodiment

The structure of a seal ring 1 according to a first embodiment of the present invention is now described with reference to FIGS. 1 to 3.

Figure 1:
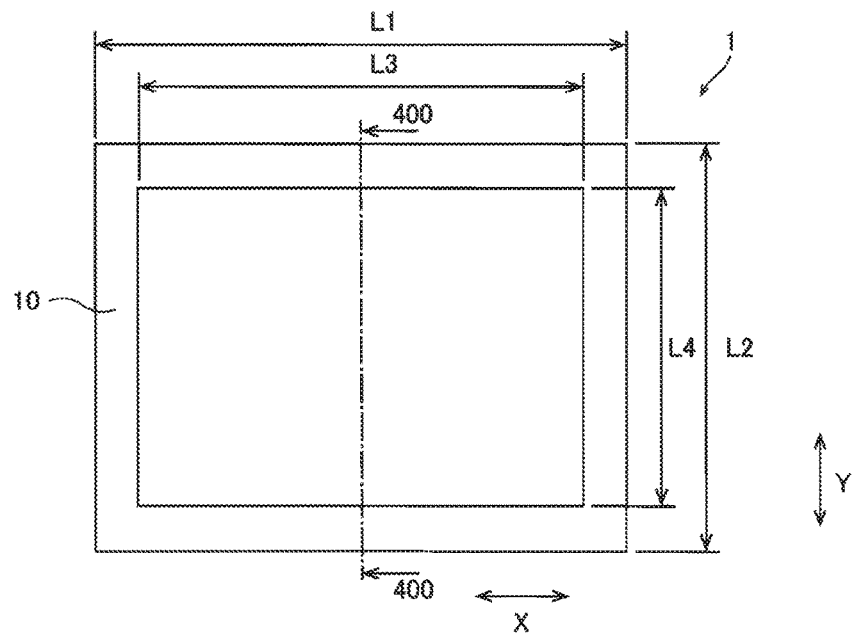
FIG. 1 A top plan view showing the structure of a seal ring according to a first embodiment of the present invention.

The seal ring 1 according to the first embodiment is in the form of a rectangular frame in a plan view, as shown in FIG. 1. This seal ring 1 is formed with a length L1 of at least about 1.5 mm and not more than about 2.0 mm in the longitudinal direction (direction X) and a length L2 of at least about 1.2 mm and not more than about 1.6 mm in the short-side direction (direction Y). An opening of the seal ring 1 is formed with a length L3 of at least about 1.3 mm and not more than about 1.6 mm in the direction X and a length L4 of at least about 0.9 mm and not more than about 1.1 mm in the direction Y.

Figure 2:
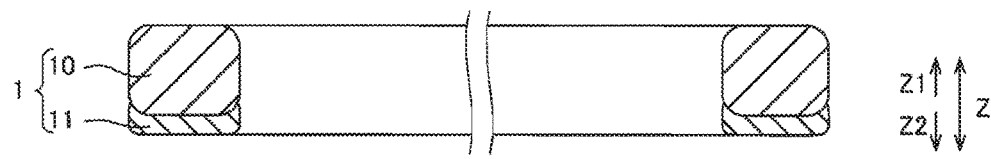
FIG. 2 A sectional view taken along the line 400-400 in FIG. 1.
Figure 3:
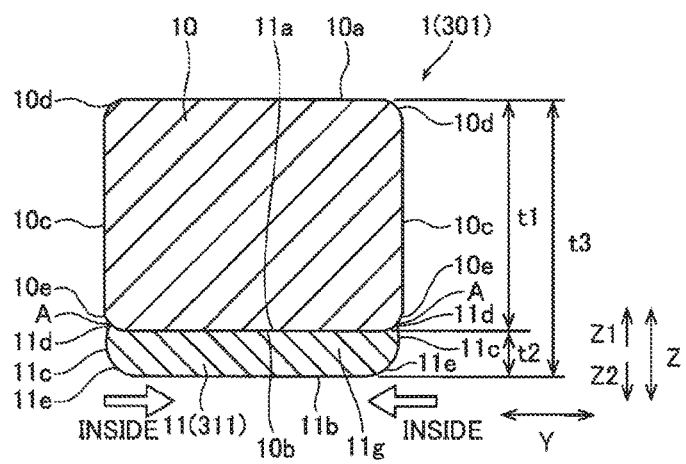
FIG. 3 An enlarged sectional view taken along the line 400-400 in FIG. 1.

The seal ring 1 is made of a clad material in which a base material layer 10 arranged on the upper side (Z1 side) and a brazing filler metal layer 11 arranged on the lower side (Z2 side) are pressure-bonded to each other, as shown in FIGS. 2 and 3. As shown in FIG. 3, the thickness t1 of the base material layer 10 in a direction Z is at least about 100 μm and not more than about 130 μm, the thickness t2 of the brazing filler metal layer 11 in the direction Z is at least about 15 μm and not more than about 30 μm, and the thickness t3 (t1+t2) of the seal ring 1 in the direction Z is at least about 115 μm and not more than about 160 μm.

The base material layer 10 is made of Fe—Ni—Co alloy mainly containing about 30 mass % of Ni, about 17 mass % of Co, and Fe. The base material layer 10 has an upper surface 10a on the Z1 side, a lower surface 10b on the Z2 side bonded to the brazing filler metal layer 11, and a pair of side surfaces 10c. The upper surface 10a, the lower surface 10b, and the pair of side surfaces 10c are substantially flattened. The base material layer 10 further has a pair of upper corners 10d connecting the upper surface 10a and the side surfaces 10c to each other and a pair of lower corners 10e connecting the lower surface 10b and the side surfaces 10c to each other. The upper corners 10d and the lower corners 10e each are formed in a rounded shape having a sufficiently small curvature radius. The lower surface 10b is an example of the "first surface" in the present invention.

The brazing filler metal layer 11 is made of silver solder mainly containing about 85 mass % of Ag and Cu. The solidus line (a temperature at which the brazing filler metal layer 11 starts to be partially melted) of the silver solder forming the brazing filler metal layer 11 is about 780° C. The brazing filler metal layer 11 has an upper surface 11a on the Z1 side bonded to the base material layer 10, a lower surface 11b on the Z2 side, and a pair of side surfaces 11c. The upper surface 11a and the lower surface 11b are substantially flattened. The side surfaces 11c are formed to be located slightly internally of the side surfaces 10c of the base material layer 10.

The brazing filler metal layer 11 further has a pair of upper corners 11d connecting the upper surface 11a closer to the base material layer 10 and the side surfaces 11c to each other and a pair of lower corners 11e connecting the lower surface 11b opposite to the base material layer 10 and the side surfaces 11c to each other. The upper corners 11d are formed to be located on the lower corners 10e of the base material layer 10. In other words, the brazing filler metal layer 11 is formed to substantially central portions A of the lower corners 10e of the base material layer 10 but not formed on the side surfaces 10c of the base material layer 10. The upper corners 11d are formed to be located internally of the side surfaces 10c of the base material layer 10 and to be located internally of the side surfaces 11c of the brazing filler metal layer 11. Consequently, peripheral borders between the lower corners 10e of the base material layer 10 and the upper corners 11d of the brazing filler metal layer 11 are formed to be concave inward from the side surfaces 10c of the base material layer 10 and the side surfaces 11c of the brazing filler metal layer 11. The lower corners 11e each are formed in a rounded shape having a sufficiently small curvature radius.

According to the first embodiment, the brazing filler metal layer 11 of the seal ring 1 is formed by removing side brazing filler metal portions 11*f* (see FIG. 7) of the brazing filler metal layer 11, described later, covering at least the substantially flattened side surfaces 10*c* of the base material layer 10. A specific process for manufacturing the seal ring 1 is described later.

The structure of an electronic component storing package 100 employing the seal ring 1 according to the first embodiment of the present invention is now described with reference to FIG. 4.

Figure 4:
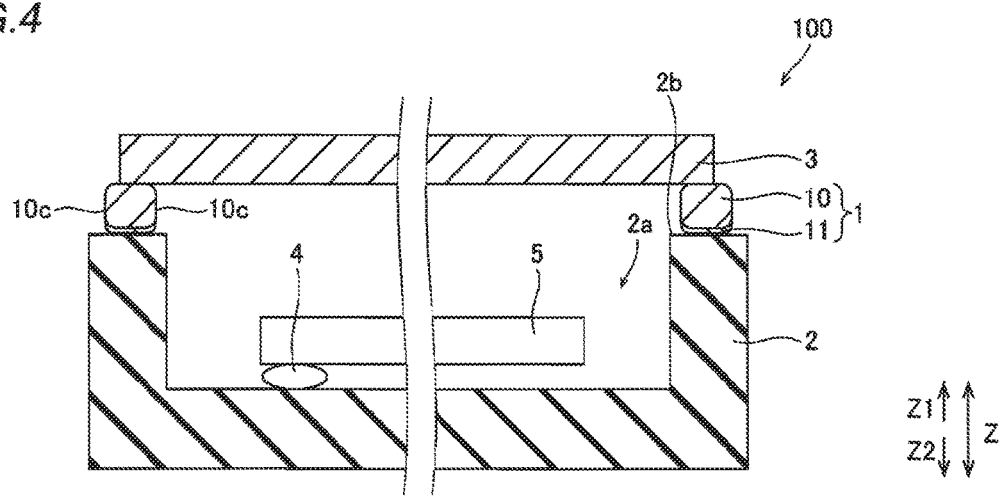
FIG. 4 A sectional view showing the structure of an electronic component storing package according to the first embodiment of the present invention.

The electronic component storing package 100 according to the first embodiment includes the seal ring 1, a base 2 bonded to the seal ring 1 below (Z2 side) the seal ring 1, and a lid member 3 bonded to the seal ring 1 above (Z1 side) the seal ring 1, as shown in FIG. 4.

The base 2 is made of ceramics such as alumina and is in the form of a box. The base 2 in the form of a box has a storing portion 2*a* formed in a central portion of the base 2, mounted with an electronic component 5 such as a crystal oscillator through a bump 4 and an upper surface 2*b* in the form of a frame bonded to the seal ring 1. The seal ring 1 and the upper surface 2*b* of the base 2 are bonded to each other by the melted brazing filler metal layer 11 of the seal ring 1. In order to improve adhesion between the upper surface 2*b* of the base 2 and the brazing filler metal layer 11, a metalization layer made of W/Ni/Au may be provided on the upper surface 2*b* of the base 2.

The lid member 3 is made of a plate member of Fe—Ni—Co alloy. The lid member 3 and the base material layer 10 of the seal ring 1 are bonded to each other by seam welding. In order to improve adhesion between the lid member 3 and the base material layer 10, a plated layer made of Ni/Au may be provided on the lid member 3.

The base 2 is formed to be slightly larger than the seal ring 1. The lid member 3 is formed to be slightly smaller than the seal ring 1 and be larger than the opening of the seal ring 1. Thus, the seal ring 1 and the base 2 are bonded to each other, and the seal ring 1 and the lid member 3 are bonded to each other, whereby the storing portion 2*a* mounted with the electronic component 5 becomes airtight.

The process for manufacturing the seal ring 1 according to the first embodiment of the present invention is now described with reference to FIGS. 3 to 7.

Figure 5:
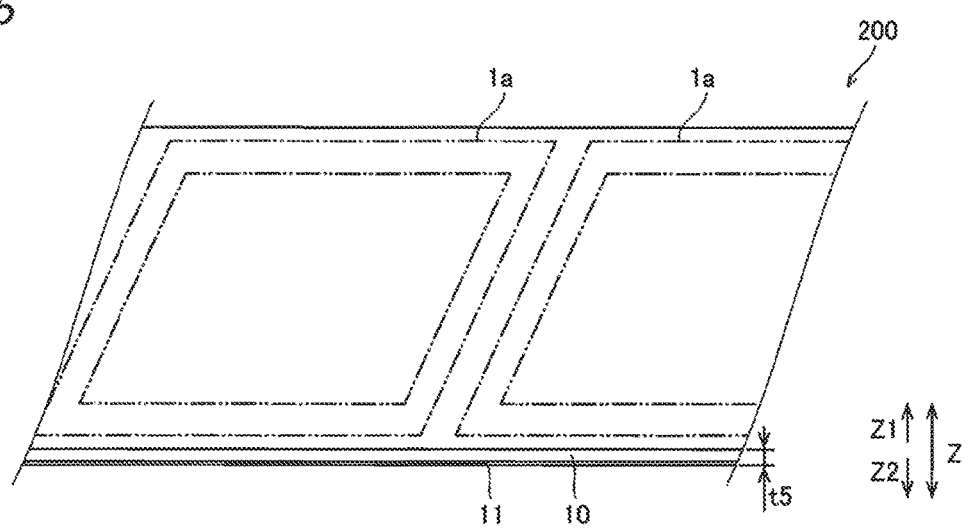
FIG. 5 A perspective view for illustrating a process for manufacturing the seal ring according to the first embodiment of the present invention.

First, a clad material 200 including the base material layer 10 made of the Fe—Ni—Co alloy and the brazing filler metal layer 11 bonded to the lower surface 10*b* (see FIG. 6) of the base material layer 10, made of the silver solder mainly containing about 85 mass % of Ag and Cu is prepared, as shown in FIG. 5. In this clad material 200, the thickness t1 (see FIG. 6) of the base material layer 10 in the direction Z is at least about 100 μm and not more than about 130 μm, and the thickness t4 (see FIG. 6) of the brazing filler metal layer 11 in the direction Z is formed to be larger by a thickness t6 (see FIG. 7) than the thickness t2 (see FIG. 3) of the brazing filler metal layer 11 in the finished seal ring 1. Consequently, the thickness t5 (t1+t4) of the clad material 200 in the direction Z is larger by the thickness t6 than the thickness t3 (t1+t2, see FIG. 3) of the seal ring 1.

The clad material 200 is punched in the shape (two-dot chain lines) of the seal ring 1 by a pressing machine. At this time, the clad material 200 is punched along the plate thickness direction (direction Z) from the side of the brazing filler metal layer 11 (Z2 side). Thus, a seal ring 1*a* punched in the shape of the seal ring 1 is formed.

Figure 6:
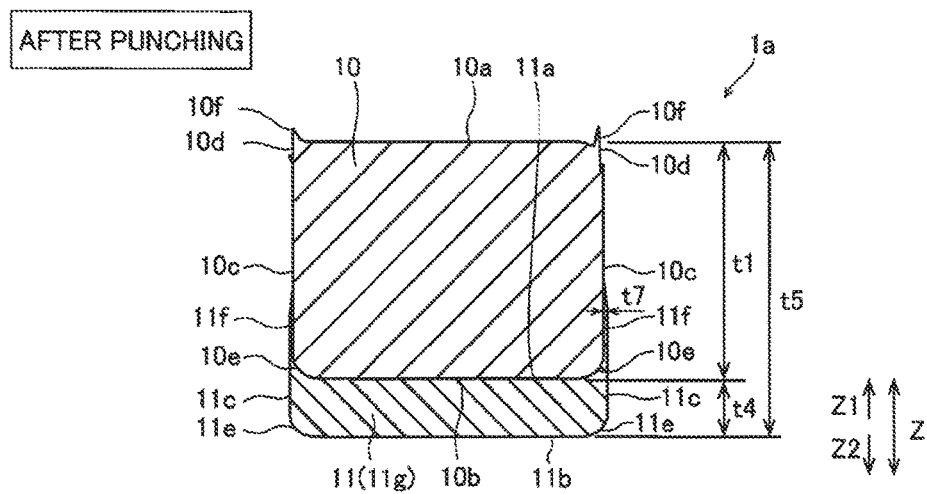
FIG. 6 An enlarged sectional view showing the seal ring after punching in the process for manufacturing the seal ring according to the first embodiment of the present invention.

When this clad material 200 is punched, tiny protrusions (burrs) 10*f* are formed on the upper corners 10*d* of the base material layer 10 of the seal ring 1*a*, as shown in FIG. 6. These tiny protrusions 10*f* are partially sharply formed to protrude upward (Z1 side) beyond the upper surface 10*a* of the base material layer 10.

Furthermore, when the clad material 200 is punched, the brazing filler metal layer 11 bonded to the lower surface 10*b* of the base material layer 10 partially moves upward (Z1 side) to stretch to the side surfaces 10*c* of the base material layer 10. Thus, the side brazing filler metal portions 11*f* connected to the brazing filler metal layer 11 are formed on the side surfaces 10*c* of the base material layer 10.

Then, barrel polishing is performed in order to remove the tiny protrusions 10*f* formed on the base material layer 10 of the seal ring 1*a*. Specifically, a plurality of seal rings 1*a*, media made of ceramics or the like, a compound made of chemical powder or the like, water, etc. are poured in a barrel. Then, the barrel is rotated at a prescribed speed for a prescribed time. Thus, the media collide against the tiny protrusions 10*f* of the base material layer 10, whereby the tiny protrusions 10*f* are removed. Thereafter, the seal rings 1*a* are taken out and are cleaned.

Figure 7:
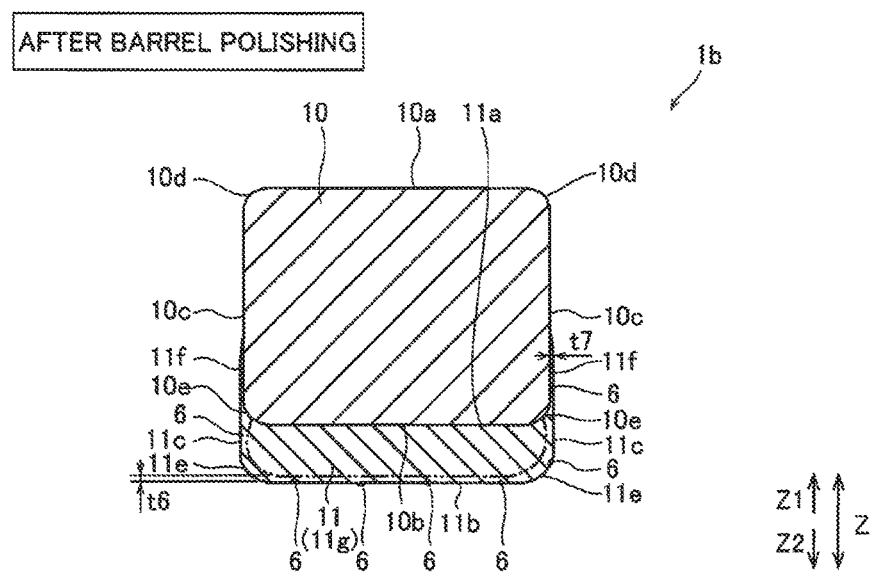
FIG. 7 An enlarged sectional view showing the seal ring after barrel polishing in the process for manufacturing the seal ring according to the first embodiment of the present invention.

Thus, the tiny protrusions 10*f* of the base material layer 10 are removed, and a seal ring 1*b* is formed, as shown in FIG. 7. In this seal ring 1*b*, the upper corners 10*d* of the base material layer 10 each are shaped into a rounded shape having a sufficiently small curvature radius. The lower corners 11*e* of the brazing filler metal layer 11 are also slightly roundly shaped. At this time, the hardness of the silver solder forming the brazing filler metal layer 11 of the seal ring 1*b* is small, and hence extraneous materials 6 including residues of the media or the like are embedded in and attached to an externally exposed surface (the lower surface 11*b*, the side surfaces 11*c*, the lower corners 11*e*, and the side brazing filler metal portions 11*f*) of the brazing filler metal layer 11.

In a method for manufacturing the seal ring 1 according to the first embodiment, wet etching is performed in order to remove the side brazing filler metal portions 11*f* formed on the brazing filler metal layer 11 of the seal ring 1*b*. Specifically, a plurality of seal rings 1*b* and an etching solution of at least about 10° C. and not more than about 30° C. are poured into a barrel.

This etching solution is constituted by an undiluted solution obtained by mixing an oxidizing agent of hydrogen peroxide, an oxide removing agent of an acetic acid or ammonia, and water in a prescribed ratio or a diluted solution obtained by diluting the undiluted solution in a prescribed ratio by further adding water. The oxidizing agent has a function of oxidizing Ag and Cu contained in the brazing filler metal layer 11 (see FIG. 7) and changing the same to a silver oxide and a copper oxide, respectively. The oxide removing agent has a function of dissolving and removing the silver oxide and the copper oxide of the brazing filler metal layer 11. The etching solution is constituted such that the silver solder of the brazing filler metal layer 11 is easily etched and the Fe—Ni—Co alloy of the base material layer 10 (see FIG. 7) is hardly etched.

Then, the barrel is rotated at a prescribed speed for a prescribed time. Thus, the brazing filler metal layer 11 is isotropically removed, whereby a surface of the brazing filler metal layer 11 is removed by the thickness t6 (see FIG. 7). On the other hand, the base material layer 10 is hardly removed.

Consequently, the side brazing filler metal portions 11*f* located on the side surfaces 10*c* of the base material layer 10, having a thickness t7 smaller than the thickness t6 are removed. In other words, portions (side brazing filler metal portions 11f) of the brazing filler metal layer 11 covering at least the substantially flattened side surfaces 10c of the base material layer 10 are removed. The lower corners 11e of the brazing filler metal layer 11 are roundly formed by being exposed to the etching solution on both the side of the lower surface 11b and the sides of the side surfaces 11c. Furthermore, the externally exposed surface of the brazing filler metal layer 11 is removed, whereby the extraneous materials 6 attached to the exposed surface of the brazing filler metal layer 11 are also removed. Consequently, the shape of the brazing filler metal layer 11 becomes such a shape that the brazing filler metal layer 11 is formed to the substantially central portions A of the lower corners 10e of the base material layer 10 but not formed on the side surfaces 10c of the base material layer 10, as shown by two-dot chain lines in FIG. 7.

Then, the oxides (the silver oxide and the copper oxide) remaining on the surface of the brazing filler metal layer 11 are removed by cleaning with a sulfuric acid or the like, and thereafter water washing (rinsing) and alcohol substitution are performed. In this manner, the seal ring 1 shown in FIG. 3 is manufactured.

A process for manufacturing the electronic component storing package 100 employing the seal ring 1 according to the first embodiment of the present invention is now described with reference to FIGS. 4 and 7 to 9.

Figure 8:
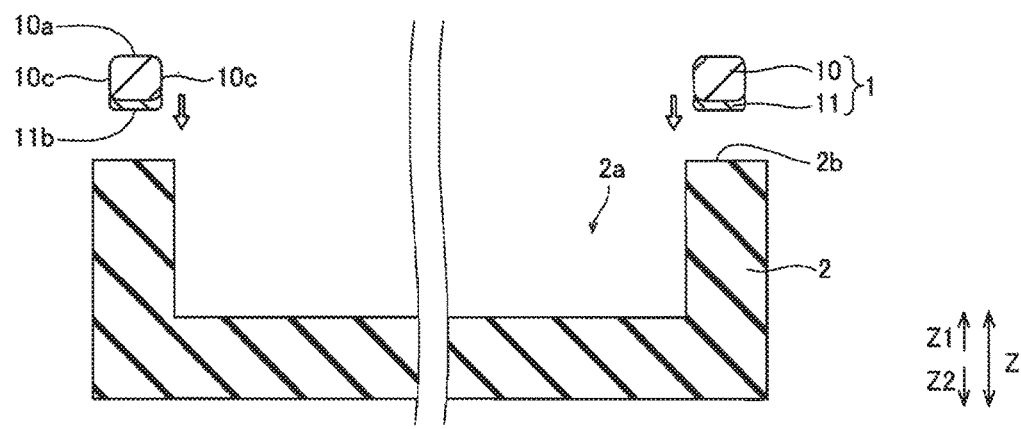
FIG. 8 A sectional view for illustrating a process for manufacturing the electronic component storing package (before bonding of the seal ring to a base) according to the first embodiment of the present invention.

First, the seal ring 1 is arranged on the upper surface 2b of the base 2 made of ceramics, as shown in FIG. 8. At this time, the seal ring 1 is arranged such that the lower surface 11b of the brazing filler metal layer 11 of the seal ring 1 comes into contact with the upper surface 2b. Then, the brazing filler metal layer 11 is melted at a brazing temperature equal to or greater than the solidus line (about 780° C.) of the silver solder forming the brazing filler metal layer 11. Thus, the seal ring 1 is bonded to the upper surface 2b of the base 2 by the melted brazing filler metal layer 11. At this time, the side brazing filler metal portions 11f (see FIG. 7) formed on the side surfaces 10c of the base material layer 10 of the seal ring 1 are removed by the wet etching, and hence the brazing filler metal layer 11 is inhibited from excessively crawling up (Z1 side) the side surfaces 10c of the base material layer 10. Thus, the crawling up of the brazing filler metal layer 11 toward the vicinity of the upper surface 10a of the base material layer 10 can be reduced.

Figure 9:
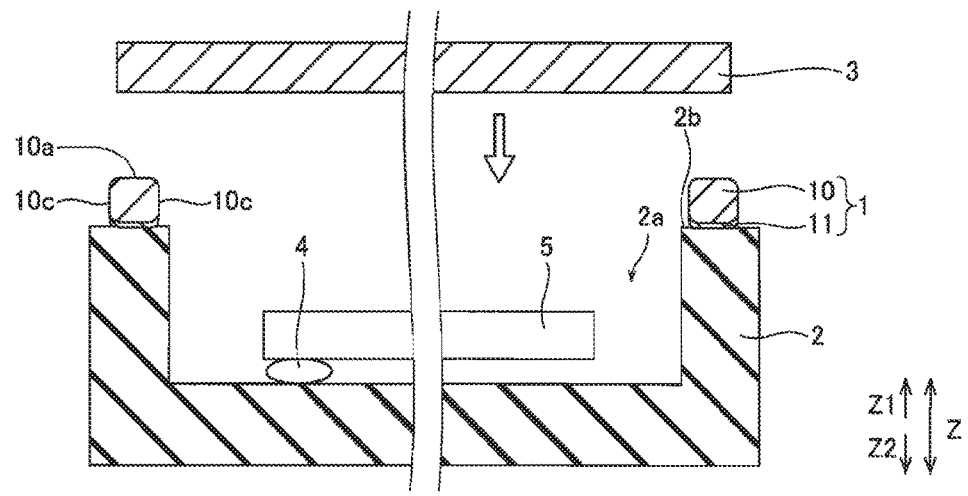
FIG. 9 A sectional view for illustrating the process for manufacturing the electronic component storing package (after the bonding of the seal ring to the base) according to the first embodiment of the present invention.

Then, the electronic component 5 is mounted through the bump 4 in the storing portion 2a of the base material 2, as shown in FIG. 9. Thereafter, the seam welding is performed in a state where the lid member 3 is brought into contact with the upper surface 10a of the base material layer 10. Thus, the lid member 3 is welded to the upper surface 10a of the seal ring 1. At this time, the brazing filler metal layer 11 is not excessively located in the vicinity of the upper surface 10a of the base material layer 10, and hence the brazing filler metal layer 11 excessively located in the vicinity of the upper surface 10a of the base material layer 10 is inhibited from partially spreading to the lower surface of the lid member 3 due to heat in the seam welding. Consequently, the brazing filler metal layer 11 is inhibited from being partially scattered to the electronic component 5 from the lower surface of the lid member 3. In this manner, the electronic component storing package 100 shown in FIG. 4 is manufactured.

According to the first embodiment, as hereinabove described, the side brazing filler metal portions 11f formed in the brazing filler metal layer 11 of the seal ring 1b, covering at least the substantially flattened side surfaces 10c of the base material layer 10 are removed by the wet etching, whereby the brazing filler metal layer 11 can be inhibited from excessively crawling up the side surfaces 10c of the base material layer 10 through the side brazing filler metal portions 11f when the brazing filler metal layer 11 of the seal ring 1 is melted to bond the base 2 of the electronic component storing package 100 and the seal ring 1 to each other. Thus, the brazing filler metal layer 11 is inhibited from partially spreading to the lower surface of the lid member 3 due to the heat in the welding when the seam welding is performed in the state where the lid member 3 is brought into contact with the upper surface 10a of the base material layer 10 of the seal ring 1. Consequently, the brazing filler metal layer 11 can be inhibited from being partially scattered from the lower surface of the lid member 3 and being attached to the electronic component 5 stored in the electronic component storing package 100.

According to the first embodiment, the wet etching is performed in order to remove the side brazing filler metal portions 11f, whereby the small side brazing filler metal portions 11f covering the side surfaces 10c of the base material layer 10 can be reliably removed as compared with the case where the side brazing filler metal portions 11f are removed by mechanical polishing or the like.

According to the first embodiment, the brazing filler metal layer 11 is isotropically removed to remove the side brazing filler metal portions 11f, and the lower corners 11e of the brazing filler metal layer 11 are roundly formed, whereby complicated etching processing is not required to selectively remove the side brazing filler metal portions 11f, and hence the side brazing filler metal portions 11f can be easily removed. Furthermore, the lower corners 11e of the brazing filler metal layer 11 are rounded not pointed, and hence other members can be inhibited from being damaged when pointed lower corners 11e of the brazing filler metal layer 11 come into contact with the other members or the like.

According to the first embodiment, a solution with which the silver solder of the brazing filler metal layer 11 is easily etched and the Fe—Ni—Co alloy of the base material layer 10 is hardly etched is employed as the etching solution, whereby the brazing filler metal layer 11 can be easily selectively etched.

According to the first embodiment, the base material layer 10 is made of the Fe—Ni—Co alloy mainly containing about 30 mass % of Ni, about 17 mass % of Co, and Fe, the brazing filler metal layer 11 is made of the silver solder mainly containing about 85 mass % of Ag and Cu, and the etching solution is constituted by the undiluted solution obtained by mixing the oxidizing agent of the hydrogen peroxide, the oxide removing agent of the acetic acid or ammonia, and the water in the prescribed ratio or the diluted solution obtained by diluting the undiluted solution in the prescribed ratio by further adding the water. Thus, the brazing filler metal layer 11 made of the silver solder can be selectively etched to effectively remove the side brazing filler metal portions 11f.

According to the first embodiment, the externally exposed surface of the brazing filler metal layer 11 is removed by the wet etching, so that the extraneous materials 6 attached to the surface of the brazing filler metal layer 11 are also removed. Thus, the extraneous materials 6 are removed simultaneously during the wet etching for removing the side brazing filler metal portions 11f, and hence the process can be simplified, unlike the case where a step of removing the extraneous materials 6 is provided separately.

Example of First Embodiment

Observation of the etched state, metal elution amount measurement, and observation of the melted state of the brazing filler metal layer conducted in order to confirm the effects of the first embodiment of the present invention are now described with reference to FIGS. 3, 4, 7, 10, and 11.

(Observation of Etched State)

First, changes in the state of the brazing filler metal layer in the case where the processing time of the wet etching was varied were observed. In this observation, the seal ring 1b (see FIG. 7) according to the aforementioned first embodiment was employed. An undiluted solution obtained by mixing an aqueous acetic acid containing a 25 mass % acetic acid, a hydrogen peroxide solution containing 35 mass % hydrogen peroxide, and water in a volume ratio of 1:5:4 was prepared as the etching solution. Thereafter, a 1:1 diluted solution in which the volume ratio of the undiluted solution and water was 1:1 was prepared and employed as the etching solution. The seal rings 1b and the etching solution were poured into the barrel, and the barrel was rotated at the prescribed speed. Thereafter, the etched state in the vicinity of the side brazing filler metal portions 11f (see FIG. 7) was observed by a scanning electron microscope (S-3400N, manufactured by Hitachi High-Technologies Corporation) at prescribed processing time intervals.

Before the wet etching, the side brazing filler metal portions were formed to cover the side surfaces of the base material layer. Due to the barrel polishing, a plurality of extraneous materials were attached to the surface of the brazing filler metal layer. In a state where the processing time of the wet etching elapsed to some extent, the side brazing filler metal portions covering the side surfaces of the base material layer were partially removed, and no extraneous material was observed. This is conceivably because the brazing filler metal layer was isotropically removed, so that the extraneous materials attached to the removed surface portion of the brazing filler metal layer were also moved into the etching solution.

When the processing time of the wet etching further elapsed, the side brazing filler metal portions covering the side surfaces were gradually removed, and boundary positions between the lower corners of the base material layer and the brazing filler metal layer came to be observed. Thus, it could be observed that the side brazing filler metal portions covering the side surfaces of the base material layer were completely removed.

It has been confirmed that as the etching solution containing the aforementioned undiluted solution is diluted by increasing the proportion of the water, the time taken to remove the side brazing filler metal portions is increased. It has been confirmed that as the temperature of the etching solution of the aforementioned 1:1 diluted solution containing the undiluted solution is increased, the time taken to remove the side brazing filler metal portions is reduced.

As the undiluted solution of the etching solution for the wet etching, an ammonia stock solution obtained by mixing ammonia water containing 35 mass % ammonia, a hydrogen peroxide solution containing 35 mass % hydrogen peroxide, and water in a volume ratio of 1:1:1 was prepared. Then, a 1:4 diluted solution in which the volume ratio of the ammonia stock solution and water was 1:4 was prepared and employed as the etching solution. It has been confirmed that the side brazing filler metal portions are removed also in the case where the wet etching is performed with this etching solution containing the ammonia stock solution.

The surface roughness of a surface of the base material layer and a surface of the brazing filler metal layer was measured before and after the wet etching. Specifically, the arithmetic average roughness Ra and the maximum height roughness Rz of the surface of the base material layer and the surface of the brazing filler metal layer were measured by a laser microscope (VK-8700, manufactured by Keyence Corporation). As a result of this measurement, the surface roughness of the surface of the base material layer and the surface of the brazing filler metal layer was hardly changed before and after the wet etching. Thus, it has been proved that the surface of the base material layer and the surface of the brazing filler metal layer are hardly roughed by the wet etching.

(Metal Elution Amount Measurement)

Next, the elution amount of the Fe—Ni—Co alloy forming the base material layer to the etching solution and the elution amount of the silver solder mainly containing 85 mass % of Ag and Cu, forming the brazing filler metal layer to the etching solution were measured. Specifically, the aforementioned seal ring 1b and the etching solution (the aforementioned 1:1 diluted solution in which the volume ratio of the undiluted solution and the water was 1:1) were poured into the barrel, and the barrel was rotated for one hour at the prescribed speed. Thus, the brazing filler metal layer of the seal ring 1b was mostly melted. Then, Ag, Cu, Fe, Ni, and Co contained in the etching solution were measured by an ICP emission spectrometer.

In the etching solution after the wet etching, Ag and Cu were contained in a ratio close to 85:15. Thus, it has been confirmable that both Ag and Cu of the brazing filler metal layer are eluted into the etching solution but only one of Ag and Cu is not preferentially eluted into the etching solution. On the other hand, the elution amount of Fe was smaller than one-thousandth of the elution amount of Cu, and neither Ni nor Co was detected. Therefore, it has been proved that the base material layer is hardly eluted into the etching solution.

(Observation of Melted State of Brazing Filler Metal Layer)

Next, the melted state of the brazing filler metal layer was observed. In this observation of the melted state of the brazing filler metal layer, each of the melted state of the brazing filler metal layer 11 of the seal ring 1 (see FIG. 3) according to Example 1 in which the side brazing filler metal portions 11f (see FIG. 7) were removed and the melted state of the brazing filler metal layer 11 of the seal ring (seal ring 1b, see FIG. 7) according to Comparative Example 1 in which the side brazing filler metal portions 11f were not removed was observed when the brazing filler metal layer 11 was melted.

Specifically, the seal ring 1 according to Example 1 and the seal ring 1b according to Comparative Example 1 each were arranged such that the Fe—Ni—Co alloy 8 in which Ni plating and Au plating were stacked on the surface and the brazing filler metal layer 11 came into contact with each other. Then, the brazing filler metal layer 11 was melted at the brazing temperature equal to or greater than the solidus line (about 780° C.) of the silver solder forming the brazing filler metal layer 11, and the seal ring 1 (1b) and a Fe—Ni—Co alloy plate 8 were bonded to each other. Thereafter, the melted state of the brazing filler metal layer 11 was observed by the scanning electron microscope.

Figure 10:
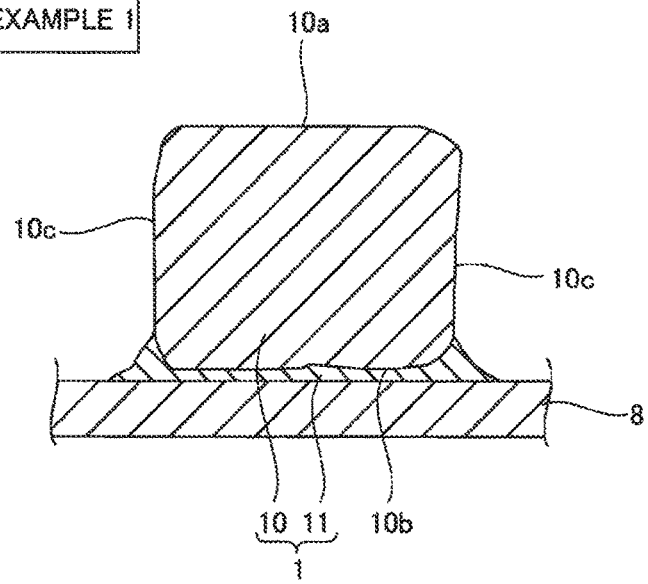
FIG. 10 An enlarged sectional view showing the melted state of a brazing filler metal layer in Example 1 conducted in order to confirm the effects of the first embodiment of the present invention.
Figure 11:
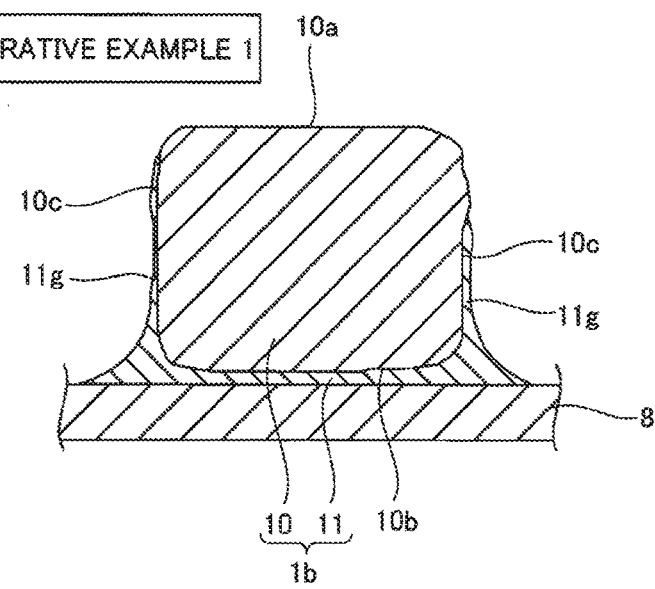
FIG. 11 An enlarged sectional view showing the melted state of a brazing filler metal layer in Comparative Example 1 conducted in order to confirm the effects of the first embodiment of the present invention.

As the melted states of the brazing filler metal layers shown in FIGS. 10 and 11, the brazing filler metal layer 11 according to Example 1 shown in FIG. 10 hardly crawled up both the side surfaces 10c of the base material layer 10, but crawling-up portions 11g of the brazing filler metal layer 11 according to Comparative Example 1 shown in FIG. 11 covered at least halves of both the side surfaces 10c of the base material layer 10 and were formed to extend to the side surfaces 10c in the vicinity of the upper surface 10a. Thus, it has been confirmable that the crawling-up amount of the brazing filler metal layer 11 according to Example 1 is sufficiently smaller than the crawling-up amount of the brazing filler metal layer 11 according to Comparative Example 1 and the brazing filler metal layer 11 according to Example 1 is hardly located on the side surfaces 10c in the vicinity of the upper surface 10a. Therefore, it has been confirmable that in the seal ring 1 according to Example 1 in which the side brazing filler metal portions 11f are removed, the brazing filler metal layer 11 can be inhibited from excessively crawling up the side surfaces 10c, as compared with the seal ring according to Comparative Example 1 in which the side brazing filler metal portions 11f are not removed.

In the aforementioned observation of the melted state of the brazing filler metal layer 11, the example of melting the brazing filler metal layer 11 of the seal ring 1 on the Fe—Ni—Co alloy plate 8 in which the Ni plating and the Au plating are stacked on the surface has been shown, but the brazing filler metal layer 11 conceivably becomes the same melted state also in the case where the brazing filler metal layer 11 of the seal ring 1 is melted on the upper surface 2a (see FIG. 4) of the base 2 made of ceramics.

Second Embodiment

The structure of a seal ring 301 according to a second embodiment of the present invention is now described with reference to FIG. 3. In this second embodiment, the case where the concentration of Ag in the vicinity of a surface of a brazing filler metal layer 311 of the seal ring 301 is larger than the concentration of Ag in an internal portion 11g of the brazing filler metal layer 311 of the seal ring 301 is described, unlike the seal ring 1 according to the aforementioned first embodiment.

The seal ring 301 according to the second embodiment is configured such that the concentration of Ag in a surface (a lower surface 11b, a pair of side surfaces 11c, a pair of upper corners 11d, and a pair of lower corners 11e) of the brazing filler metal layer 311 and in its vicinity is at least about 90 mass %, unlike the aforementioned first embodiment. This concentration is larger than the concentration (about 85 mass %) of Ag of brazing filler metal itself (brazing filler metal before wet etching) of the brazing filler metal layer 311 and the concentration (about 85 mass %) of Ag in the inner portion 11g of the brazing filler metal layer 311. The remaining structure of the seal ring 301 according to the second embodiment is similar to that of the seal ring 1 according to the aforementioned first embodiment.

A process for manufacturing the seal ring 301 according to the second embodiment of the present invention is now described with reference to FIGS. 3 and 5 to 7.

Similarly to the aforementioned first embodiment, a seal ring 1a punched in the form of the seal ring 1 as shown in FIG. 6 is first formed of a clad material 200 including a base material layer 10 made of Fe—Ni—Co alloy and a brazing filler metal layer 11 made of silver solder mainly containing about 85 mass % of Ag and Cu, as shown in FIG. 5. Then, barrel polishing is performed in order to remove tiny protrusions 10f formed on the base material layer 10 of the seal ring 1a, and a seal ring 1b in which the tiny protrusions 10f of the base material layer 10 are removed is formed, as shown in FIG. 7. Then, the wet etching is performed in order to remove side brazing filler metal portions 11f formed on the brazing filler metal layer 11 of the seal ring 1b. Specifically, a plurality of seal rings 1b and an etching solution of at least about 10° C. and not more than about 30° C. are poured into a barrel.

According to the second embodiment, a solution obtained by further adding a strong acid of a dilute sulfuric acid to the undiluted solution or the diluted solution is employed as the etching solution, unlike the aforementioned first embodiment in which the undiluted solution obtained by mixing the oxidizing agent of the hydrogen peroxide, the oxide removing agent of the acetic acid or ammonia, and the water in the prescribed ratio or the diluted solution obtained by diluting the undiluted solution in the prescribed ratio by further adding the water is employed as the etching solution. This dilute sulfuric acid is added to the etching solution such that the concentration of the dilute sulfuric acid is at least about 0.5 mass % of the entire etching solution. At this time, the dilute sulfuric acid is added to the etching solution such that the concentration of the dilute sulfuric acid is preferably at least about 0.5 mass % and not more than 1.0 mass % of the entire etching solution and more preferably at least about 0.7 mass % and not more than 1.0 mass % of the entire etching solution.

This dilute sulfuric acid has a function of preferentially removing a copper oxide of an oxide (a silver oxide and the copper oxide) of the brazing filler metal layer 311 (see FIG. 3) of hydrogen peroxide. Thus, on the surface (the lower surface 11b, the pair of side surfaces 11c, the pair of upper corners 11d, and the pair of lower corners 11e) of the brazing filler metal layer 311, the copper oxide is more preferentially removed and consumed than the silver oxide by the sulfuric acid, and hence the oxidation rate of Cu is also increased along with the removal rate of the copper oxide. Consequently, Cu is preferentially removed.

Then, the barrel is rotated at a prescribed speed for a prescribed time. Thus, the brazing filler metal layer 311 is isotropically removed, but the base material layer 10 is hardly removed. Furthermore, Cu in the vicinity of the surface of the brazing filler metal layer 311 is preferentially removed, whereby the concentration of Ag in the vicinity of the surface of the brazing filler metal layer 311 becomes at least about 90 mass %. Consequently, the concentration of Ag in the vicinity of the surface of the brazing filler metal layer 311 becomes larger than the concentration (about 85 mass %) of Ag of the brazing filler metal itself (the brazing filler metal before the wet etching) of the brazing filler metal layer 311 and the concentration (about 85 mass %) of Ag in the inner portion 11g of the brazing filler metal layer 311.

Before and after the aforementioned wet etching, the solidus line (a temperature at which the brazing filler metal layer 311 partially starts to be melted) of silver solder forming the brazing filler metal layer 311 remains substantially unchanged at about 780° C. In other words, despite the increase in the concentration of Ag in the vicinity of the surface of the brazing filler metal layer 311, the solidus line of the silver solder remains substantially unchanged at about 780° C.

By the aforementioned wet etching, the oxide (the silver oxide and the copper oxide) remaining on the surface of the brazing filler metal layer 311 is mostly removed, and hence water washing (rinsing) and alcohol substitution are directly performed without performing a step of removing the oxide remaining on the surface of the brazing filler metal layer 311 by cleaning with the sulfuric acid or the like, unlike the aforementioned first embodiment. In this manner, the seal ring 301 shown in FIG. 3 is manufactured.

According to the second embodiment, as hereinabove described, the side brazing filler metal portions 11f formed in the brazing filler metal layer 311 of the seal ring 1b, covering at least the substantially flattened side surfaces 10c of the base material layer 10 are removed by the wet etching, whereby the brazing filler metal layer 311 can be inhibited from excessively crawling up the side surfaces 10c of the base material layer 10 through the side brazing filler metal portions 11f.

According to the second embodiment, the concentration of Ag in the vicinity of the surface of the brazing filler metal layer 311 is rendered larger than the concentration (about 85 mass %) of Ag of the brazing filler metal itself (the brazing filler metal before the wet etching) of the brazing filler metal layer 311 and the concentration (about 85 mass %) of Ag in the inner portion 11g of the brazing filler metal layer 311 by preferentially removing Cu in the vicinity of the surface of the brazing filler metal layer 311, employing the solution obtained by further adding the strong acid of the dilute sulfuric acid whose concentration is at least about 0.5 mass % to the undiluted solution or the diluted solution as the etching solution. Thus, Ag has corrosion resistance as compared with Cu, and hence due to Ag in the vicinity of the surface of the brazing filler metal layer 311, the corrosion resistance of the surface of the brazing filler metal layer 311 can be further improved than that before the wet etching. Furthermore, the concentration of Ag in the vicinity of the surface of the brazing filler metal layer 311 is large, whereby the color of the surface of the brazing filler metal layer 311 can be brought close to silver. In addition, Cu in the surface of the brazing filler metal layer 311 can be preferentially removed with the etching solution to which a Cu preferentially removing agent is added, and hence the concentration of Ag in the vicinity of the surface of the brazing filler metal layer 311 can be easily rendered larger than the concentration of Ag in the inner portion 11g of the brazing filler metal layer 311, and Ag can be caused to remain and be concentrated in the vicinity of the surface of the brazing filler metal layer 311.

According to the second embodiment, the solution obtained by further adding the strong acid of the dilute sulfuric acid to the undiluted solution or the diluted solution is employed as the etching solution, whereby the oxide of Cu can be reliably preferentially removed. Thus, Cu in the surface of the brazing filler metal layer 311 can be easily preferentially removed.

According to the second embodiment, despite the increase in the concentration of Ag in the vicinity of the surface of the brazing filler metal layer 311 after the wet etching as compared with before the wet etching, the solidus line (the temperature at which the brazing filler metal layer 311 starts to be partially melted) of the silver solder forming the brazing filler metal layer 311 can remain substantially unchanged at about 780° C., and hence an increase in temperature required to melt the brazing filler metal layer 311 resulting from a rise in the solidus line (about 780° C.) of the brazing filler metal layer 311 can be suppressed.

According to the second embodiment, no step (in general, a step of cleaning the surface of the seal ring 311 with the sulfuric acid) of removing the silver oxide and the copper oxide remaining on the surface of the seal ring 311 and cleaning the seal ring after the wet etching may be provided separately, and hence the process can be simplified.

Example of Second Embodiment

Measurement of the concentration in the surface of the brazing filler metal layer, measurement of the concentration in the depth direction of the brazing filler metal layer, measurement of the solidus line, and a corrosion resistance test conducted in order to confirm the effects of the second embodiment of the present invention are now described with reference to FIGS. 3, 7, and 12 to 15.

(Measurement of Concentration in Surface of Brazing Filler Metal Layer)

First, the concentrations of Cu and Ag in the surface of the brazing filler metal layer were measured. In this measurement, the seal ring 1b (see FIG. 7) including the base material layer 10 made of the Fe—Ni—Co alloy and the brazing filler metal layer 11 made of the silver solder containing 85 mass % of Ag and 15 mass % of Cu was prepared. Then, the seal ring 1b was directly employed as a seal ring according to Comparative Example 2 without the wet etching. On the other hand, the wet etching was performed on the seal ring 1b in each of Examples 2 and 3.

At this time, in Example 2 corresponding to the aforementioned first embodiment, an undiluted solution obtained by mixing an aqueous acetic acid containing a 25 mass % acetic acid, a hydrogen peroxide solution containing 35 mass % hydrogen peroxide, and water in a volume ratio of 1:5:4 was prepared. Thereafter, a 1:4 diluted solution in which the volume ratio of the undiluted solution and water was 1:4 was prepared and employed as the etching solution. Then, the seal rings 1b and the etching solution were poured into the barrel under the temperature condition of 25° C., and the barrel was rotated at the prescribed speed. Thereafter, cleaning or the like was performed. Thus, the seal ring 1 (see FIG. 3) according to Example 2 was obtained.

In Example 3 corresponding to the aforementioned second embodiment, on the other hand, a solution obtained by adding a dilute sulfuric acid of a strong acid to the aforementioned 1:4 diluted solution was employed as the etching solution. At this time, the concentration of a sulfuric acid was adjusted to 0.7 mass % of the entire etching solution. Then, similarly to Example 2, the seal ring 1b and the etching solution were poured into the barrel under the temperature condition of 25° C., and the barrel was rotated at the prescribed speed. Thereafter, water washing or the like was performed. Thus, the seal ring 301 (see FIG. 3) according to Example 3 was obtained.

Then, two places in a surface of each of the seal ring 1b according to Comparative Example 2, the seal ring 1 according to Example 2, and the seal ring 301 according to Example 3 were observed by an electron probe microanalyser (EPMA). Then, the rate of the abundance of Cu to the sum of the abundance of Cu and the abundance of Ag in the surface of the brazing filler metal layer was obtained as the concentration of Cu, and the rate of the abundance of Ag to the sum of the abundance of Cu and the abundance of Ag in the surface of the brazing filler metal layer was obtained as the concentration of Ag.

Figures 12, 13:
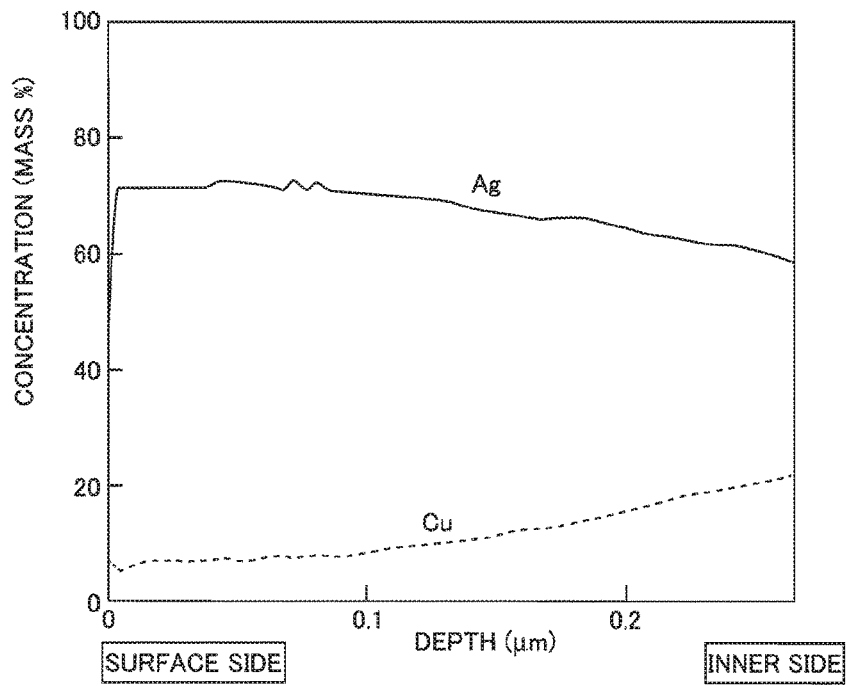
FIG. 12 A diagram showing results of measurement of the concentrations of Cu and Ag in a surface of a brazing filler metal layer conducted in order to confirm the effects of a second embodiment of the present invention.
FIG. 13 A diagram showing results of measurement of the concentrations of Cu and Ag in the depth direction of the brazing filler metal layer conducted in order to confirm the effects of the second embodiment of the present invention.

As shown in FIG. 12, in the case where the etching solution to which no sulfuric acid was added was employed, as in Example 2, the concentration of Cu was increased, and the concentration of Ag was reduced after the wet etching as compared with before the wet etching (Comparative Example 2). This is conceivably because the speed of removing an oxide of Ag (silver oxide) became higher than the speed of removing an oxide of Cu (copper oxide) with an acetic acid (oxide removing agent) alone, and Ag was relatively preferentially removed.

In the case where the etching solution to which a 0.7 mass % sulfuric acid was added was employed as in Example 3, on the other hand, the concentration of Cu was reduced, and the concentration of Ag was increased after the wet etching as compared with before the wet etching (Comparative Example 2). This is conceivably because the speed of removing the copper oxide became higher than the speed of removing the silver oxide by adding the sulfuric acid in addition to the acetic acid, and hence Cu was preferentially removed. Consequently, it has been proved that Cu in the surface of the brazing filler metal layer can be preferentially removed by adding the sulfuric acid to the etching solution, and hence Ag in the surface of the brazing filler metal layer can be caused to remain and be concentrated by increasing the concentration of Ag in the surface of the brazing filler metal layer as compared with the concentration of Ag before the wet etching (Comparative Example 2).

(Measurement of Concentration in Depth Direction of Brazing Filler Metal Layer)

Next, employing the aforementioned seal ring 301 according to Example 3, the concentrations of Cu and Ag in the depth direction (a direction orthogonal to the surface of the brazing filler metal layer 311) of the brazing filler metal layer were measured by an auger electron spectroscope.

As shown in FIG. 13, the concentration of Ag in the seal ring 301 according to Example 3 was gradually increased from the inner portion of the brazing filler metal layer toward the surface thereof. On the other hand, the concentration of Cu was gradually reduced from the inner portion of the brazing filler metal layer toward the surface thereof. Consequently, it has been proved that Cu in the surface of the brazing filler metal layer can be preferentially removed by adding the sulfuric acid to the etching solution, and hence Ag in the surface of the brazing filler metal layer can be caused to remain and be concentrated by increasing the concentration of Ag in the vicinity of the surface of the brazing filler metal layer as compared with the concentration of Ag in the inner portion of the brazing filler metal layer.

In the seal ring 301 according to Example 3, the reduction in the concentration of Ag and the increase in the concentration of Cu were slow within a range from the surface of the brazing filler metal layer to a depth of 0.1 μm as compared with other ranges. Thus, Cu within the range from the surface of the brazing filler metal layer to the depth of 0.1 μm can be conceivably stably removed by adding the sulfuric acid to the etching solution.

(Measurement of Solidus Line)

Next, the solidus line was measured in order to confirm changes in the solidus line of the brazing filler metal layer before and after the wet etching. In this measurement of the solidus line, in addition to the aforementioned Comparative Example 2 and Example 3, the seal rings 301 according to Examples 4 to 6 were manufactured by the wet etching employing the etching solutions in which the concentrations of the sulfuric acids added to the aforementioned 1:4 diluted solutions were different from each other. In Examples 4, 5, and 6, the concentrations of the sulfuric acids were adjusted to 0.3 mass %, 0.5 mass %, and 1.0 mass % of the entire etching solution, respectively. The conditions of the wet etching in Examples 4 to 6 are the same as the condition in the aforementioned Example 3. The solidus lines (temperatures at which the brazing filler metal layers start to be partially melted) of the brazing filler metal layers of the seal ring 1b according to Comparative Example 2 and the seal rings 301 according to Examples 3 to 6 were measured by differential thermal analysis (DTA).

As shown in FIG. 14, the solidus lines got slightly higher as the concentrations of the sulfuric acids added to the etching solutions were increased. However, the solidus lines of the brazing filler metal layers according to Examples 3 to 6 were within 1.5° C. (at least 776.1° C. (Example 4) and not more than 777.4° C. (Example 6)) of the solidus line (776.0° C.) of the brazing filler metal layer before the wet etching (Comparative Example 2), and there is conceivably little difference in temperature. Consequently, it has been confirmable that the solidus lines of the brazing filler metal layers are hardly changed before and after the wet etching.

(Corrosion Resistance Test)

Next, the corrosion resistance test was performed. In this corrosion resistance test, a constant temperature and humidity test in which the seal ring 1b according to the aforementioned Comparative Example 2 and the seal ring 301 according to the aforementioned Example 3 were left for 1000 hours under the constant temperature and humidity condition of 85° C. and 85% Rh (relative humidity) was conducted. Then, the surface of the seal ring 1b according to Comparative Example 2 and the surface of the seal ring 301 according to Example 3 after the constant temperature and humidity test were observed by the electron probe microanalyser (EPMA). Then, the concentrations (abundance rates) of O (oxygen), Cu, and Ag in the surfaces of the brazing filler metal layers were obtained.

As shown in FIG. 15, in Example 3, the concentration of oxygen in the surface of the brazing filler metal layer became lower as compared with Comparative Example 2. Thus, it has been proved that oxidation in the surface of the brazing filler metal layer after the wet etching is suppressed in the case where the wet etching is performed with the etching solution to which the 0.7 mass % sulfuric acid is added as in Example 3, as compared with the case where no wet etching is performed as in Comparative Example 2. This is conceivably because in the seal ring 301 according to Example 3, Ag relatively difficult to oxidize exists in a larger amount than Cu relatively easy to oxidize in the surface of the brazing filler metal layer, and the oxidation in the surface of the brazing filler metal layer is suppressed. Consequently, it has been proved that the oxidation in the surface of the brazing filler metal layer can be suppressed by performing the wet etching with the etching solution to which the sulfuric acid is added as in Example 3, and hence the corrosion resistance of the surface of the brazing filler metal layer can be improved.

The embodiments disclosed this time must be considered as illustrative in all points and not restrictive. The range of the present invention is shown not by the above description of the embodiments but by the scope of claims for patent, and all modifications within the meaning and range equivalent to the scope of claims for patent are further included.

For example, while the example of removing the side brazing filler metal portions 11f of the brazing filler metal layer 11 by the wet etching has been shown in each of the aforementioned first and second embodiments, the present invention is not restricted to this. According to the present invention, the side brazing filler metal portions may be removed by a method other than the wet etching, such as dry etching.

While the example of forming the brazing filler metal layer 11 to the substantially central portions A of the lower corners 10e of the base material layer 10 has been shown in each of the aforementioned first and second embodiments, the present invention is not restricted to this. According to the present invention, the brazing filler metal layer may be formed to regions in the vicinity of the side surfaces of the base material layer on the lower corners of the base material layer. Alternatively, the brazing filler metal layer may not be formed on the lower corners of the base material layer but may be formed only on the lower surface of the base material layer.

While the example of employing at least the undiluted solution obtained by mixing the oxidizing agent of the hydrogen peroxide, the oxide removing agent of the acetic acid or ammonia, and the water in the prescribed ratio or the diluted solution obtained by diluting the undiluted solution in the prescribed ratio by further adding the water as the etching solution has been shown in each of the aforementioned first and second embodiments, the present invention is not restricted to this. According to the present invention, an oxidizing agent other than the hydrogen peroxide may be employed, or an acid or base other than the acetic acid or ammonia may be employed as the oxide removing agent. Alternatively, ammonium fluoride may be employed as the oxide removing agent.

While the example of employing the etching solution with which the silver solder of the brazing filler metal layer 11 is easily etched and the Fe—Ni—Co alloy of the base material layer 10 is hardly etched has been shown in each of the aforementioned first and second embodiments, the present invention is not restricted to this. According to the present invention, an etching solution with which the Fe—Ni—Co alloy of the base material layer is also etched to some extent may be employed. Thus, a step of performing the barrel polishing for removing the tiny protrusions can be omitted, or the time taken to perform the barrel polishing can be reduced.

While the example of employing the silver solder mainly containing about 85 mass % of Ag and Cu has been shown in each of the aforementioned first and second embodiments, the present invention is not restricted to this. Silver solder mainly containing about 72 mass % of Ag and Cu may be employed, for example. Alternatively, brazing filler metal containing Sn in addition to Ag and Cu may be employed. In this case, the solidus line of the brazing filler metal can be lowered, and hence the brazing temperature can be lowered. In the case where the brazing filler metal contains Sn, not more than about 6 mass % Sn is preferably contained in order to suppress difficulty in rolling when the clad material is formed.

While the example of employing the strong acid of the dilute sulfuric acid as the solution added to the undiluted solution or the diluted solution has been shown in the aforementioned second embodiment, the present invention is not restricted to this. A strong acid other than the sulfuric acid, such as a hydrochloric acid may be added to the undiluted solution or the diluted solution, for example. Alternatively, a solution other than the strong acid may be employed as the Cu preferentially removing agent so far as Cu can be preferentially removed.

REFERENCE NUMERALS 1, 301: seal ring
6: extraneous material
10: base material layer
10b: lower surface (first surface)
10c: side surface
10f: tiny protrusion
11, 311: brazing filler metal layer
11f: side brazing filler metal portion
11g: inner portion
100: electronic component storing package
200: clad material

The invention claimed is:

1. A method for manufacturing a seal ring (1) employed in an electronic component storing package (100), comprising steps of:
preparing a clad material (200) of a base material layer (10) and a brazing filler metal layer (11) bonded to a first surface (10b) of the base material layer;
punching the clad material in the form of the seal ring; and
removing a side brazing filler metal portion (11f) of the brazing filler metal layer formed by stretching of the brazing filler metal layer when the clad material is punched in the form of the seal ring, covering a side surface (10c) of the base material layer.

2. The method for manufacturing a seal ring according to claim 1, wherein
the base material layer includes a rounded corner (10e) connecting the first surface of the base material layer and the side surface substantially flattened to each other, and
the step of removing the side brazing filler metal portion includes a step of removing at least the side brazing filler metal portion of the brazing filler metal layer covering the side surface substantially flattened.

3. The method for manufacturing a seal ring according to claim 1, wherein
the step of removing the side brazing filler metal portion includes a step of removing the side brazing filler metal portion by wet etching.

4. The method for manufacturing a seal ring according to claim 3, wherein
the step of removing the side brazing filler metal portion by the wet etching includes a step of removing the side brazing filler metal portion by isotropically removing the brazing filler metal layer by the wet etching.

5. The method for manufacturing a seal ring according to claim 4, wherein
the step of isotropically removing the brazing filler metal layer by the wet etching includes a step of removing the side brazing filler metal portion by the wet etching and roundly forming a corner (11e) of the brazing filler metal layer.

6. The method for manufacturing a seal ring according to claim 3, wherein
the step of removing the side brazing filler metal portion by the wet etching includes a step of removing the side brazing filler metal portion with an etching solution with which the brazing filler metal layer is easily etched and the base material layer is hardly etched.

7. The method for manufacturing a seal ring according to claim 6, wherein
the base material layer mainly contains Fe, Ni, and Co,
the brazing filler metal layer mainly contains Ag and Cu, and
the etching solution contains at least an oxidizing agent oxidizing a surface of the brazing filler metal layer, an oxide removing agent removing the brazing filler metal layer which has been oxidized, and water.

8. The method for manufacturing a seal ring according to claim 7, wherein
the etching solution contains at least the oxidizing agent of hydrogen peroxide, the oxide removing agent of an acetic acid, and the water.

9. The method for manufacturing a seal ring according to claim 3, wherein
the brazing filler metal layer mainly contains Ag and Cu,
an etching solution of the wet etching contains an oxidizing agent oxidizing a surface of the brazing filler metal layer, an oxide removing agent removing the brazing filler metal layer which has been oxidized, water, and a Cu preferentially removing agent preferentially removing the Cu in the surface of the brazing filler metal layer, and
the step of removing the side brazing filler metal portion by the wet etching includes a step of rendering a concentration of the Ag larger in the vicinity of the surface of the brazing filler metal layer than in an inner portion (11g) of the brazing filler metal layer by preferentially removing the Cu in the surface of the brazing filler metal layer with the etching solution.

10. The method for manufacturing a seal ring according to claim 3, wherein
the brazing filler metal layer mainly contains Ag and Cu,
an etching solution of the wet etching contains an oxidizing agent oxidizing a surface of the brazing filler metal layer, an oxide removing agent removing the brazing filler metal layer which has been oxidized, water, and a Cu preferentially removing agent preferentially removing the Cu in the surface of the brazing filler metal layer, and
the step of removing the side brazing filler metal portion by the wet etching includes a step of rendering a concentration of the Ag larger in the vicinity of the surface of the brazing filler metal layer than in the brazing filler metal layer before removal of the side brazing filler metal portion by the wet etching by preferentially removing the Cu in the surface of the brazing filler metal layer with the etching solution.

11. The method for manufacturing a seal ring according to claim 9, wherein
the Cu preferentially removing agent comprises a strong acid.

12. The method for manufacturing a seal ring according to claim 11, wherein
the Cu preferentially removing agent comprises a sulfuric acid which is the strong acid.

13. The method for manufacturing a seal ring according to claim 12, wherein
the sulfuric acid is added to the etching solution such that a concentration of the sulfuric acid is at least 0.5 mass % of an entire portion of the etching solution.

14. The method for manufacturing a seal ring according to claim 9, wherein
a solidus line of the brazing filler metal layer is not substantially changed before and after the step of removing the side brazing filler metal portion by the wet etching.

15. The method for manufacturing a seal ring according to claim 9, wherein
the step of removing the side brazing filler metal portion by the wet etching also serves as a step of removing the brazing filler metal layer which has been oxidized, remaining on a surface of the seal ring and cleaning the seal ring.

16. The method for manufacturing a seal ring according to claim 3, further comprising a step of removing a tiny protrusion (10f) of the base material layer formed when the clad material is punched in the form of the seal ring in advance of the step of removing the side brazing filler metal portion by the wet etching, wherein
the step of removing the side brazing filler metal portion by the wet etching includes a step of removing by the wet etching the side brazing filler metal portion and an extraneous material (6) attached when the tiny protrusion is removed.

* * * * *